United States Patent [19]

Bierschenk et al.

[11] Patent Number: 4,922,822
[45] Date of Patent: May 8, 1990

[54] THERMOELECTRIC COOLER

[76] Inventors: James L. Bierschenk, 4805 Highgate La., Rowlett, Tex. 75088; Edward J. Burke, 1700 Hearthstone, Plano, Tex. 75023

[21] Appl. No.: 283,501

[22] Filed: Dec. 12, 1988

[51] Int. Cl.⁵ .............................................. H01L 35/28
[52] U.S. Cl. .................................... 136/204; 136/239; 136/241
[58] Field of Search ............... 136/203, 204, 277, 239, 136/241

[56] References Cited

U.S. PATENT DOCUMENTS

| | | | |
|---|---|---|---|
| 3,666,566 | 5/1972 | Paine | 136/202 |
| 3,902,923 | 9/1975 | Evans et al. | 136/203 |
| 4,004,210 | 1/1977 | Yater | 136/200 |
| 4,111,717 | 9/1978 | Baxter | 136/225 X |
| 4,558,342 | 12/1985 | Sclar | 136/225 X |
| 4,686,320 | 8/1987 | Novak et al. | 136/239 |

Primary Examiner—Peter A. Nelson

[57] ABSTRACT

A thermoelectric cooler device having thermoelectric elements of n and p type semiconductor material arranged in rows and columns between insulating substrates of alumina or beryllia, or ceramic materials having a known emissivity is coated with material(s) having an emissivity substantially lower than that of the thermoelectric cooler. The coating includes a layer of insulating material on at least a portion of the surfaces of the thermoelectric cooler, a layer of diffusion barrier forming material on the insulating layer, and a layer of low emissivity material on the diffusion barrier layer. For example, the insulating layer is silicon dioxide having a thickness of about 10,000 Angstroms, the diffusion barrier layer is titanium tungsten having a thickness of about 400–500 Angstroms, and the low emissivity layer is gold having a thickness of about 1,000 Angstroms.

2 Claims, 1 Drawing Sheet

4,922,822

THERMOELECTRIC COOLER

This invention relates to thermoelectric coolers and more particularly to a thermoelectric cooler having improved cooling efficiency.

BACKGROUND OF THE INVENTION

Thermoelectric coolers are very sensitive to thermal loads of convection, conduction, and radiation types. For protection against convection and conduction type thermal loads, thermoelectric coolers have been inclosed in vacuum type packages (DEWARS, for example), but as the temperature of the thermoelectric cooler is substantially below that of the interior side of the vacuum package, the thermoelectric cooler remains subject to radiation type thermal loads.

To reduce the radiation type thermal load, upper stages of thermoelectric coolers have been enclosed in close fitting enclosures forming thermal radiation shields, which are mounted on the supporting substrates of the thermoelectric cooler. An aperture is provided in the top side of the housing through which, for example, thermal energy from a source thereof passes for detection by a detector mounted on the thermoelectric cooler for cooling to its operating temperature.

Thermoelectric coolers constructed as described above, typically achieve cold side temperatures as low as minus 100 degrees Celsius. They produce about 10 to 20 milliwatts of cooling power while consuming about 3 to 10 watts of power.

These known thermoelectric coolers have certain disadvantages. Namely, they are expensive to manufacture for applications requiring the use of the radiation shield. In addition to the cost of the radiation shield, the labor cost of assembly is increased because of the cost of mounting the shield on the substrate. Another disadvantage is the relative low operating efficiency of the known thermoelectric coolers.

SUMMARY OF THE INVENTION

Accordingly it is an object of the invention to provide a thermoelectric cooler having improved operating efficiency for producing either the same milliwatt cooling power while using less power, or more cooling capacity per watt of power consumption.

Briefly stated the improved thermoelectric cooler constituting the invention includes effectively coating a thermoelectric cooler having semiconductor n-p type thermal elements with suitable material or layers of materials having an emissivity substantially lower than that of the materials of the thermoelectric cooler for reducing substantially the radiation loading of the thermoelectric cooler.

BRIEF DESCRIPTION OF THE DRAWINGS

Other objects and features of the invention will become more readily apparent from the following detailed description when read in conjunction with the accompanying drawings, in which.

DETAILED DESCRIPTION OF THE INVENTION

Figure 1:
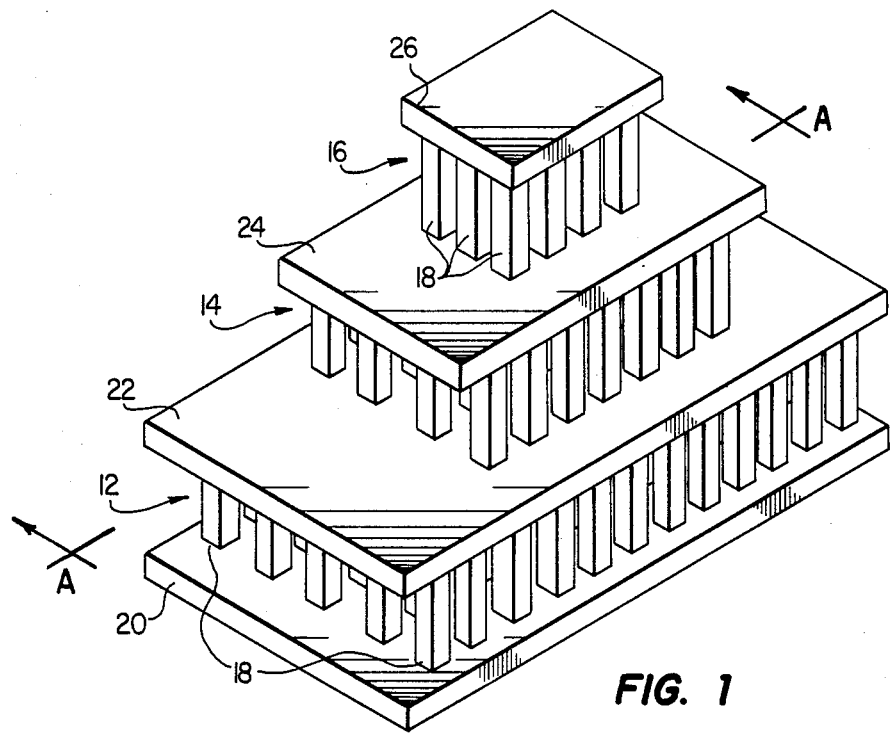
FIG. 1 is an isometric view of the thermoelectric cooler constituting the invention.

Referring now to FIG. 1, the thermoelectric cooler (TEC) of the invention is shown, for example, as a three stage cooler 10 for purposes of description only and not by way of limitation. That is, the TEC could have any number of stages.

The thermoelectric cooler (TEC) 10 (FIG. 1) includes three vertically stacked stages 12, 14, and 16. Stages 12, 14, and 16 each include a plurality of thermoelectric elements 18 arranged, for example, in rows and columns. The thermoelectric elements 18 are made of n and p type semiconductor material such as bismuth telluride ($Bi_2Te_3$). The thermoelectric elements of stage 12 are sandwiched between substrates 20 and 22 with the thermoelectric elements of stage 14 sandwiched between substrates 22 and 24, and the thermoelectric elements of stage 16 sandwiched between substrates 24 and 26. The substrates 20, 22, 24, and 26 are insulating substrates made of a suitable substrate material such as, for example, alumina ($Al_2O_3$) or beryllia ($BeO_2$), or a suitable plastic material such as Kapton.

Radiation heat loads on a surface are proportional to the surface emissivities (e) as given by Boltzmann's law:

$$q = eFkA(T_1^4 - T_2^4)$$

where q is the net radiation heat exchange between surfaces 1 and 2,
e is the emissivity function,
F is the shape factor,
k is the Boltzmann constant
A is the surface area,
$T_1$ is the temperature of surface 1 (vacuum package),
$T_2$ is the temperature of surface 2 (TEC).

From the above equation one skilled in the art will readily recognize that any reduction in the surface emissivity will have a proportional reduction on the thermal heat load.

Figure 2:
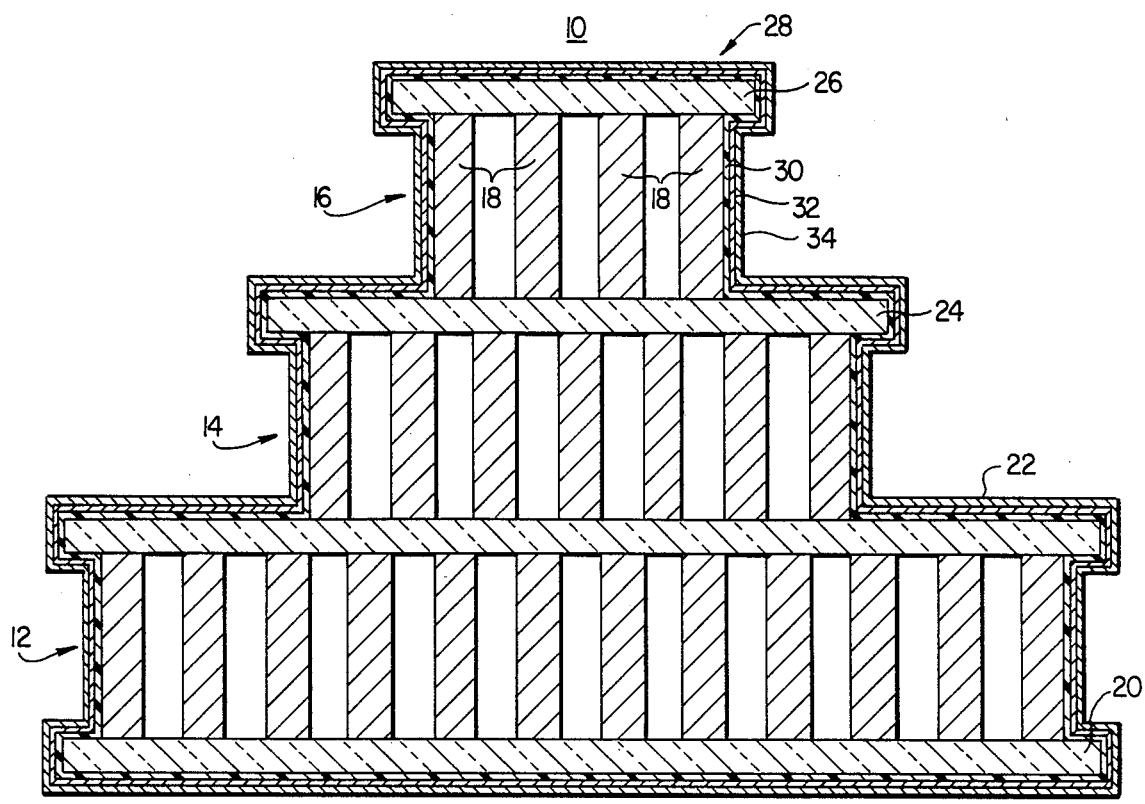
FIG. 2 is a cross-sectional view of the thermoelectric cooler of the invention taken along line A—A of FIG. 1.

Typical beryllia substrates and bismuth telluride thermoelectric elements have emissivities of about 0.7 and 0.45 respectively. Thus, to reduce the thermal loads on the TEC, a layered coating 28 (FIG. 2) of material(s) having an emissivity substantially lower than that of the TEC is formed on surfaces of the TEC confronting the vacuum package or the TEC housing, if used.

Although several materials have emissivities below those of the described TEC, it is important to recognize that the emissivity of materials increases with oxidation. A good example is gold having an emissivity of 0.02 and being oxidation resistant is preferred as the TEC coating material for reducing substantially the radiation load on the cooler. This does not in any way restrict the invention to the use of gold as the low emissiting material. Any material having an emissivity lower than that of the TE material could be used.

However, gold is a good electrical conductor and if not insulated from the thermoelectric elements it will short out the TEC. Thus, if gold or any other conductive low emissivity material is used an insulation layer is required to insulate this material from the TEC. In addition, the insulation layer must be kept thin in order to reduce the conductive heat loads between stages of the cooler. Silicon dioxide or any other suitable dielectric insulator could be used as the insulation layer. Further, many metals including gold will diffuse into other materials. Thus, if gold, for example, is permitted to diffuse into the thermoelectric material it will degrade the thermoelectric properties of the thermoelectric material and the performance of the device will also degrade. Thus, to keep gold from coming into contact with the thermoelectric material, the insulation layer must fully cover all surfaces that are to be gold coated. In addition, a third layer of material may be needed to improve adhesion of the low emissivity material to the insulation material and provide a better diffusion barrier. If gold and silicon dioxide are the low emissivity and insulation material used, titanium tungsten meets these requirement and is preferred as the diffusion barrier layer.

To protect the TEC from radiation type energy, it is not necessary to coat all the surfaces of the TEC, but only those subject to radiation type heat exposure. Thus, it is not necessary to coat the surfaces of thermoelectric elements shielded by other elements or the surfaces of the substrates shielded by thermoelectric elements.

EXAMPLE

After the thermoelectric cooler is fabricated using well known fabrication techniques, it is placed in a materials sputtering apparatus. The TEC is positioned first to sputter an insulation layer 30 (FIG. 2) of silicon dioxide on all surfaces subject to exposure of radiation thermal energy. The silicon dioxide layer is deposited to a thickness of about 10,000 Angstroms using well known sputtering techniques. Next, a diffusion barrier layer 32 of titanium tungsten is sputtered onto the insulation layer 30. The titanium tungsten layer 32 is deposited on the silicon dioxide layer to a thickness of about 400-500 Angstroms. Finally, a low emissivity gold layer 34 is sputtered onto the diffusion barrier layer. The gold layer is sputtered onto the titanium tungsten layer to a thickness of about 1,000 Angstroms.

Although only a single embodiment of this invention has been described, it will be apparent to a person skilled in the art that various modifications to the materials and details of construction shown and described may be made without departing from the scope of this invention.

What is claimed is:

1. A thermoelectric cooler device comprising:
  a thermoelectric cooler means of materials having a known emissivity, the cooler means having exterior surfaces; and
  a coating of material on at least a portion of the exterior surfaces of the thermoelectric cooler means, said coating of material having an insulating layer formed on the thermoelectric cooler means, a diffusion barrier layer formed on the insulation layer, said diffusion barrier layer being titanium tungsten, and a layer of low emissivity material formed on the diffusion barrier layer and having an emissivity sufficiently below that of the materials of the thermoelectric cooler means for reducing substantially thermal radiation loads on the thermoelectric cooler means whereby the cooling efficiency of the thermoelectric cooler device is improved.

2. A thermoelectric cooler device comprising:
  a thermoelectric cooler means of materials having a known emissivity, the cooler means having exterior surfaces; and
  a coating of material on at least a portion of the exterior surfaces of the thermoelectric cooler means, said coating of material having an emissivity sufficiently below that of the materials of the thermoelectric cooler means for reducing substantially thermal radiation loads on the thermoelectric cooler means whereby the cooling efficiency of the thermoelectric cooler device is improved,
  wherein the coating of material includes an insulating layer formed on the thermoelectric cooler means, a diffusion barrier layer formed on the insulation layer, and a layer of low emissivity material formed on the diffusion barrier layer,
  wherein the insulating layer formed on the thermoelectric cooler means is a layer of silicon dioxide having a thickness of about 10,000 angstroms, the diffusion barrier layer formed on the insulating layer is a layer of titanium tungsten having a thickness of about 400-500 Angstroms, and the layer of low emissivity material formed on the diffusion barrier layer is gold having a thickness of about 1,000 Angstroms, and
  wherein the insulating layer of silicon dioxide on the thermoelectric cooler means, the diffusion barrier layer of titanium tungsten on the insulation layer, and the low emissivity layer of gold on the diffusion barrier layer are sputtered layers.

* * * * *